(12) United States Patent
Lim et al.

(10) Patent No.: US 8,048,742 B2
(45) Date of Patent: Nov. 1, 2011

(54) TRANSISTOR INCLUDING BULB-TYPE RECESS CHANNEL AND METHOD FOR FABRICATING THE SAME

(75) Inventors: Kwan-Yong Lim, Ichon-shi (KR);
Hong-Seon Yang, Ichon-shi (KR);
Dong-Sun Sheen, Ichon-shi (KR);
Se-Aug Jang, Ichon-shi (KR);
Heung-Jae Cho, Ichon-shi (KR);
Yong-Soo Kim, Ichon-shi (KR);
Min-Gyu Sung, Ichon-shi (KR);
Tae-Yoon Kim, Ichon-shi (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 492 days.

(21) Appl. No.: 11/819,888

(22) Filed: Jun. 29, 2007

(65) Prior Publication Data

US 2008/0079093 A1  Apr. 3, 2008

(30) Foreign Application Priority Data

Sep. 28, 2006  (KR) .................. 10-2006-0095171

(51) Int. Cl.
*H01L 21/8234* (2006.01)

(52) U.S. Cl. .............. 438/270; 438/271; 257/E21.384; 257/E21.419

(58) Field of Classification Search ............... 438/270, 438/271; 257/E21.419, E21.384
See application file for complete search history.

(56) References Cited

U.S. PATENT DOCUMENTS

| 7,432,155 | B2 * | 10/2008 | Park | ............... | 438/259 |
| 2006/0289931 | A1 * | 12/2006 | Kim et al. | ............... | 257/330 |
| 2007/0077713 | A1 * | 4/2007 | Ha et al. | ............... | 438/270 |

FOREIGN PATENT DOCUMENTS

| KR | 10-2000-0060693 | 10/2000 |
| KR | 10-2002-0055938 | 7/2002 |
| KR | 10-2006-0023308 | 3/2006 |
| KR | 10-2006-0058959 | 6/2006 |

\* cited by examiner

*Primary Examiner* — Asok Sarkar
*Assistant Examiner* — Julia Slutsker
(74) *Attorney, Agent, or Firm* — IP & T Group LLP

(57) ABSTRACT

A method for fabricating a transistor including a bulb-type recess channel includes forming a bulb-type recess pattern in a substrate, forming a gate insulating layer over the substrate and the bulb-type recess pattern, forming a first gate conductive layer over the gate insulating layer, forming a void movement blocking layer over the first gate conductive layer in the bulb-type recess pattern, and forming a second gate conductive layer over the void movement blocking layer and the first gate conductive layer.

11 Claims, 7 Drawing Sheets

TRANSISTOR INCLUDING BULB-TYPE RECESS CHANNEL AND METHOD FOR FABRICATING THE SAME

RELATED APPLICATIONS

This application claims the benefit of priority of Korean patent application number 10-2006-0095171, filed on Sep. 28, 2006, which is incorporated herein by reference in its entirety.

BACKGROUND

1. Technical Field

The present invention generally relates to a method for fabricating a semiconductor device, and more particularly, to a transistor including a bulb-type recess channel and a method for fabricating the same.

2. Description of the Related Art

With the increase of integration of semiconductor devices, there is a requirement for a memory array transistor with sub-100 nm design rule. The sub-100 nm array transistor has very low threshold voltage due to the short channel effect, and thus a data retention time is gradually decreased.

A transistor having a recess channel has been developed to overcome the above limitation. The transistor having the recess channel has a long data retention time because a channel length is longer than that of a typical planar type transistor.

Recently, a method for extending the recess channel length has been proposed to obtain improved data retention time characteristics and improved current characteristics compared to a typical transistor having a recess channel. To this end, a bottom portion of a trench in the recess channel is additionally etched in the shape of a ball to thereby form a so-called bulb-type recess channel array transistor (BRCAT).

FIG. 1 illustrates a cross-sectional view of a typical method for forming a transistor including a bulb-type recess channel. A bulb-type recess pattern 12, configured with a trench pattern 12A and a ball pattern 12B, is formed in a substrate 11. A gate insulating layer 13 is formed over a surface of bulb-type recess pattern 12. A gate conductive layer 14 to be used as a gate electrode is formed over gate insulating layer 13 such that gate conductive layer 14 fills bulb-type recess pattern 12. Gate conductive layer 14 may include a polysilicon.

In the typical bulb-type recess channel, however, since the diameter of ball pattern 12B is greater than the width of trench pattern 12A in bulb-type recess pattern 12, gate conductive layer 14 does not completely fill ball pattern 12B when forming gate conductive layer 14. Therefore, a void V is often formed in the center of gate conductive layer 14 in ball pattern 12B.

In particular, void V may move toward gate insulating layer 13 while gate conductive layer 14 is being recrystallized by a subsequent high temperature thermal process. Consequently, a portion of gate insulating layer 13 may not be in contact with gate conductive layer 14 where void V exists.

FIG. 2 illustrates a cross-sectional view showing a state where void V moves toward gate insulating layer 13 of ball pattern 12B after a high temperature thermal process. The high temperature thermal process may be performed in a temperature range of approximately 650° C. to approximately 1,050° C. Gate conductive layer 14 may include a polysilicon.

Void V formed in the center of gate conductive layer 14 in ball pattern 12B moves toward gate insulating layer 13 to be in contact with gate insulating layer 13. The reason void V moves during the subsequent high temperature thermal process because a vacancy dissolved in gate conductive layer 14 at an equilibrium state causes void V in the center of gate conductive layer 14 in ball pattern 12B to grow and move during the high temperature thermal process. The vacancy refers to a type of lattice defect where atoms are dislodged from normal lattice positions in a crystal, which is also called an empty lattice point or a vacancy lattice point.

The reason for the vacancy movement is that the thickness of the polysilicon layer, i.e., gate conductive layer 14, in trench pattern 12A is greater than that in ball pattern 12B. That is, since the thickness of the polysilicon layer tends to become uniform while being recrystallized during the subsequent thermal process, the void in the polysilicon layer also moves correspondingly, resulting in changing the thickness of the polysilicon layer in ball pattern 12B.

SUMMARY

Embodiments consistent with the present invention provide a transistor including a bulb-type recess channel, which can prevent a void in a ball pattern from moving toward a gate insulating layer during a subsequent thermal process, and a method for fabricating the same.

Consistent with an embodiment of the present invention, there is provided a method for fabricating a transistor including a bulb-type recess channel, including: forming a bulb-type recess pattern in a substrate; forming a gate insulating layer over the substrate and the bulb-type recess pattern; forming a first gate conductive layer over the gate insulating layer; forming a void movement blocking layer over the first gate conductive layer in the bulb-type recess pattern; and forming a second gate conductive layer over the void movement blocking layer and the first gate conductive layer.

Consistent with another embodiment of the present invention, there is provided a transistor including a bulb-type recess channel, including: a substrate including a bulb-type recess pattern; a gate insulating layer formed over the substrate; a first gate conductive layer formed over the gate insulating layer; a void movement blocking layer formed over the first gate conductive layer in the bulb-type recess pattern, the void movement blocking layer reducing movement of a void; and a second gate conductive layer formed over the void movement blocking layer and the first gate conductive layer.

DETAILED DESCRIPTION

Figure 1:
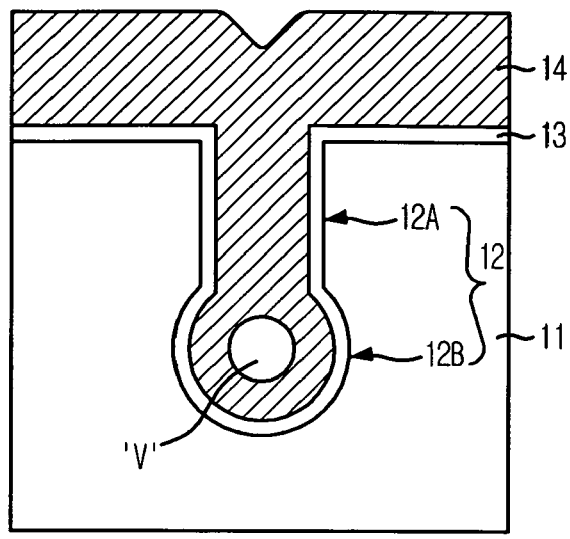
FIG. 1 illustrates a cross-sectional view of a typical method for forming a transistor including a bulb-type recess channel.
Figure 2:
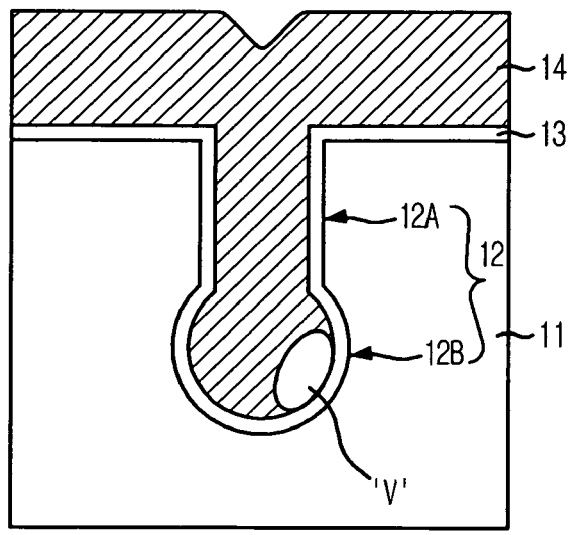
FIG. 2 illustrates a cross-sectional view showing a state where a void moves after a high temperature thermal process.
Figure 3:
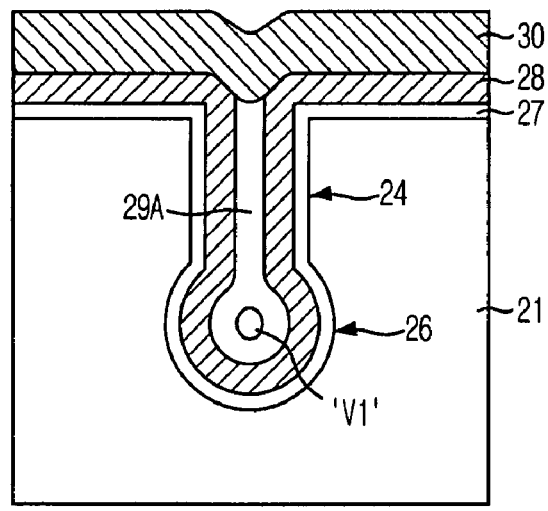
FIG. 3 illustrates a cross-sectional view showing a structure of a transistor including a bulb-type recess channel consistent with an embodiment of the present invention.

FIG. 3 illustrates a cross-sectional view showing a structure of a transistor including a bulb-type recess channel, e.g., a bulb-type recess channel array transistor (BRCAT), consistent with an embodiment of the present invention. A bulb-type recess pattern including a trench pattern 24 having a vertical profile and a ball pattern 26 having a rounded profile is formed in a substrate 21. A diameter of ball pattern 26 is greater than a width of trench pattern 24. For example, trench pattern 24 may have a width ranging from approximately 100 Å to approximately 200 Å.

A gate insulating layer 27 is formed over surfaces of the bulb-type recess pattern and substrate 21. Examples of a material that may be used for gate insulating layer 27 include one selected from the group consisting of silicon oxide ($SiO_2$), silicon oxynitride (SiON), silicon nitride ($Si_3N_4$), hafnium silicate (HfSiO), hafnium silicon oxynitride (HfSiON), and a combination thereof.

A first polysilicon layer 28 is formed over gate insulating layer 27. A liner 29A is formed over first polysilicon layer 28 such that liner 29A fills ball pattern 26 and trench pattern 24. First polysilicon layer 28 may be doped in situ with impurities such as phosphorous or boron. The impurities may be doped at a doping concentration ranging from approximately $5 \times 10^{19}$ cm$^{-3}$ to approximately $5 \times 10^{20}$ cm$^{-3}$. First polysilicon layer 28 has a thickness less than half of a width of trench pattern 24. First polysilicon layer 28 may be formed to a thickness ranging from approximately 30 Å to approximately 300 Å. Thus, it may be possible to prevent the occurrence of a void. In particular, a liner layer for forming liner 29A may be formed to a thickness ranging from approximately 30 Å to approximately 300 Å in a temperature range of approximately 25° C. to approximately 900° C. Examples of materials that may be used for forming liner 29A include $SiO_2$, SiON, $Si_3N_4$, spin on glass (SOG), phosphosilicate glass (PSG), where concentration of phosphorus (P) is in a range of approximately 0.5% to approximately 10%, and borosilicate glass (BSG), where concentration of boron (B) is in a range of approximately 0.5% to approximately 10%. Liner 29A formed in ball pattern 26 has a void V1 formed therein.

Liner 29A acts as a void movement blocking layer for reducing the movement of first polysilicon layer 28 during a subsequent thermal process such as a formation process of a second polysilicon layer 30. Second polysilicon layer 30 is formed over liner 29A and first polysilicon layer 28. Second polysilicon layer 30 may be doped in situ with impurities such as phosphorous or boron. The impurities may be doped at a doping concentration ranging from approximately $5 \times 10^{19}$ cm$^{-3}$ to approximately $5 \times 10^{20}$ cm$^{-3}$.

First polysilicon layer 28 has a certain thickness suitable for preventing the occurrence of the void, and liner 29A is formed over first polysilicon layer 28 such that liner 29A fills the bulb-type recess pattern. Thus, the movement of void V1 is decreased during the subsequent thermal process. That is, since liner 29A is inserted between portions of first polysilicon layer 28 in the bulb-type recess pattern, the movement of first polysilicon layer 28 is controlled even during the subsequent high temperature thermal process. Thus, void V1 stays in the center of liner 29A.

Figure 4A:
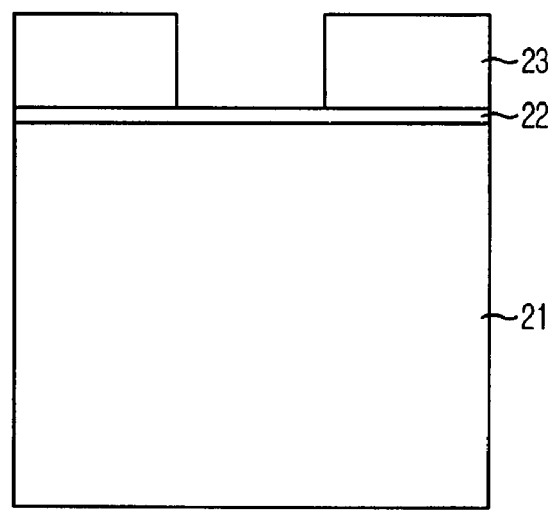
FIGS. 4A to 4J illustrate cross-sectional views of a method for fabricating the transistor including the bulb-type recess channel consistent with an embodiment of the present invention.

FIGS. 4A to 4J illustrate cross-sectional views of a method for fabricating a transistor including a bulb-type recess channel consistent with an embodiment of the present invention. Referring to FIG. 4A, a hard mask 22 is formed over a substrate 21 which has undergone certain prefabrication processes. For example, a silicon substrate and an isolation structure (not shown) may be formed in substrate 21. Hard mask 22 may include a dielectric material such as silicon oxide ($SiO_2$). Hard mask 22 will be used in a subsequent etch process for forming a bulb-type recess channel gate. A mask pattern 23 is formed on hard mask 22 using a photoresist layer.

Figure 4B:
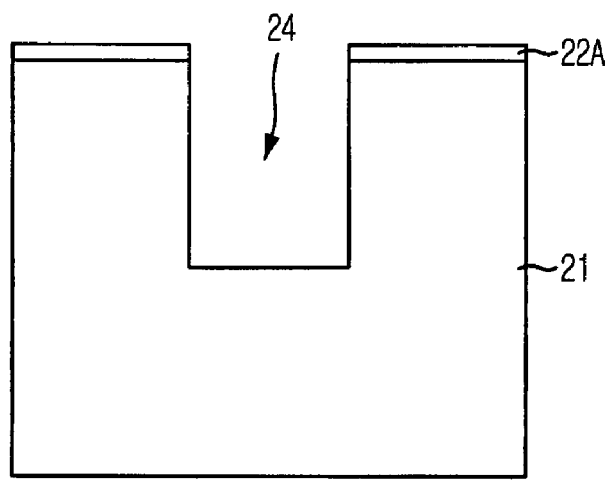

Referring to FIG. 4B, hard mask 22 is etched using mask pattern 23 as an etch barrier, and a residual hard mask 22A is left remaining. A portion of substrate 21 is exposed by etching hard mask 22 to a certain depth such that only residual hard mask 22A remains, thereby forming a trench pattern 24 of a bulb-type recess channel gate. Trench pattern 24 has a vertical profile and may be formed to have a width ranging from approximately 100 Å to approximately 200 Å. After the formation of trench pattern 24, mask pattern 23 may be removed. In this case, residual hard mask 22A acts as an etch barrier.

Figure 4C:
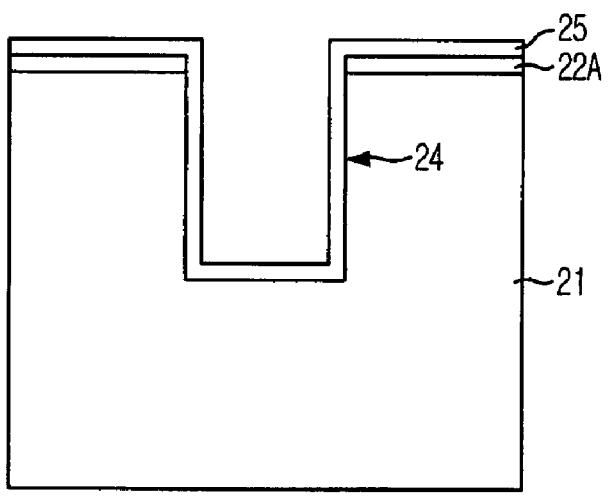

Referring to FIG. 4C, a spacer dielectric layer 25 is formed over residual hard mask 22A and over substrate 21 in trench pattern 24. Spacer dielectric layer 25 may include silicon oxide ($SiO_2$), silicon nitride ($Si_3N_4$), or silicon oxynitride (SiON). Spacer dielectric layer 25 may be formed to a thickness ranging from approximately 30 Å to approximately 150 Å.

Figure 4D:
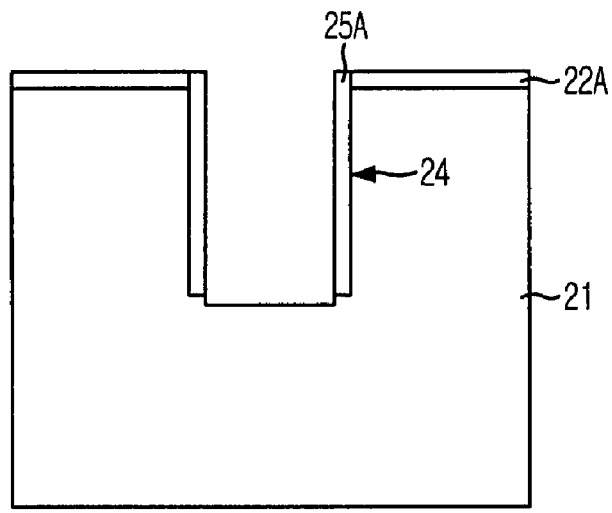

Referring to FIG. 4D, portions of spacer dielectric layer 25 are etched to have a spacer dielectric pattern 25A remaining on sidewalls of trench pattern 24. Spacer dielectric layer 25 is etched by performing a vertical etching using an etch-back process. Accordingly, upper surfaces of residual hard mask 22A and a bottom surface of trench pattern 24 are exposed by the etch-back process. Thus, spacer dielectric pattern 25A remains on the sidewalls of trench pattern 24 and sidewalls of residual hard mask 22A. A portion of residual hard mask 22A may be removed during the etch-back process of spacer dielectric layer 25.

Figure 4E:
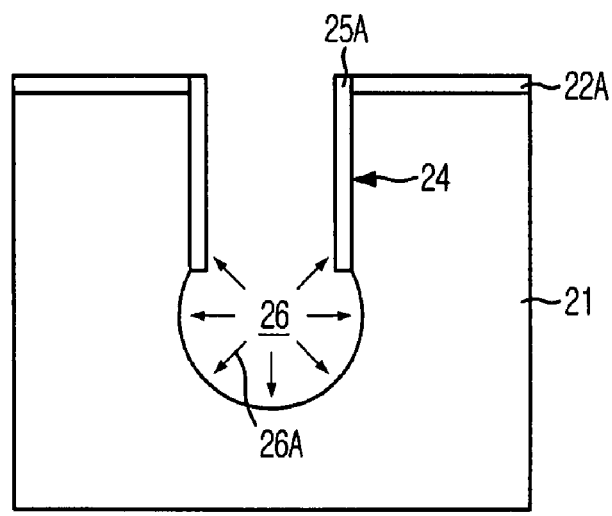

Referring to FIG. 4E, an isotropic etch 26A is performed on the exposed bottom surface of trench pattern 24 to form a ball pattern 26 having a rounded profile. Isotropic etch 26A may be performed using tetrafluoromethane ($CF_4$)/oxygen ($O_2$) plasma.

Figure 4F:
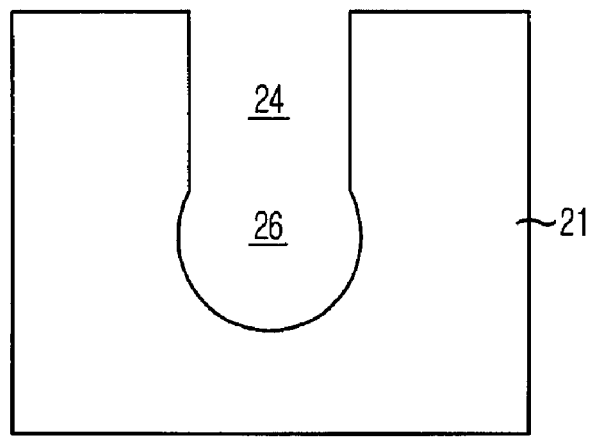

Referring to FIG. 4F, spacer dielectric pattern 25A and residual hard mask 22A are removed through a wet etching process. Spacer dielectric pattern 25A and residual hard mask 22A are removed using a solution containing hydrogen fluoride (HF) when spacer dielectric pattern 25A and residual hard mask 22A include an oxide-based material. Alternatively, when spacer dielectric pattern 25A and residual hard mask 22A include a nitride-based material, spacer dielectric pattern 25A and residual hard mask 22A are removed using a phosphoric acid ($H_3PO_4$). A bulb-type recess pattern including trench pattern 24 and ball pattern 26 is formed through the wet etching process, wherein ball pattern 26 has a diameter greater than the width of trench pattern 24.

Figure 4G:
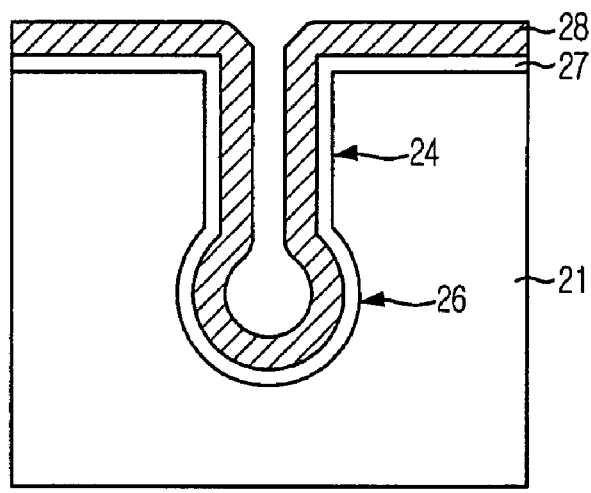

Referring to FIG. 4G, a gate insulating layer 27 is formed over substrate 21. Gate insulating layer 27 may include one selected from a group consisting of silicon oxide ($SiO_2$), silicon oxynitride (SiON), silicon nitride ($Si_3N_4$), hafnium silicate (HfSiO), hafnium silicon oxynitride (HfSiON), and a combination thereof.

A first conductive layer 28 with a certain thickness is formed over gate insulating layer 27. First conductive layer 28 may include a polysilicon. Thus, first conductive layer 28 is referred to as first polysilicon layer 28 hereinafter. First polysilicon layer 28 is formed to the certain thickness such that an opening of the bulb-type recess pattern is not closed. Thus, a void may not occur. That is, first polysilicon layer 28 is formed to a thickness that does not allow the void to form in the bulb-type recess pattern.

First polysilicon layer 28 may be deposited at a temperature ranging from approximately 450° C. to approximately 650° C. First polysilicon layer 28 may be doped in situ with impurities such as phosphorous or boron. The impurities may be doped at a doping concentration ranging from approximately $5 \times 10^{19}$ cm$^{-3}$ to approximately $5 \times 10^{20}$ cm$^{-3}$.

First polysilicon layer 28 has a thickness less than half of a width of trench pattern 24. For instance, first polysilicon layer 28 may be deposited to a thickness ranging from approximately 30 Å to approximately 300 Å. Accordingly, a void may not be generated.

Figure 4H:
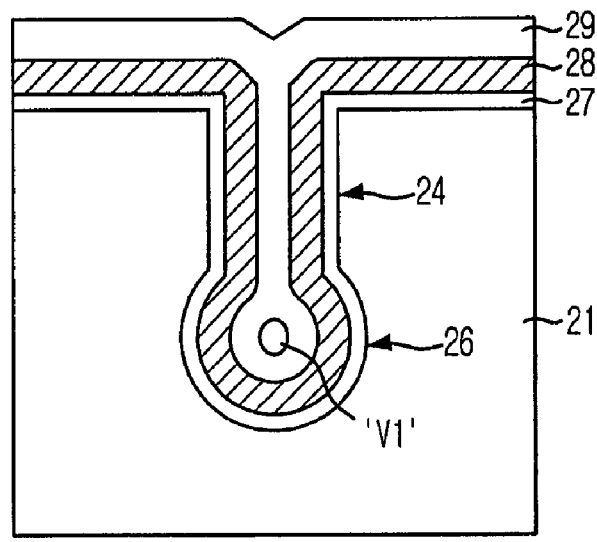

Referring to FIG. 4H, a liner layer 29 is formed over first polysilicon layer 28 such that liner layer 29 fills a space in ball pattern 26 and trench pattern 24. Formation of liner layer 29 may result in a void V1 forming in ball pattern 26 because the diameter of ball pattern 26 is greater than the width of trench pattern 24.

Liner layer 29 may be deposited to a thickness ranging from approximately 30 Å to approximately 300 Å in a temperature range of approximately 25° C. to approximately 900° C. Examples of a material that may be used for liner layer 29 include $SiO_2$, SiON, $Si_3N_4$, SOG, PSG, where concentration of P is in the range of approximately 0.5% to approximately 10%, and BSG, where concentration of B is in the range of approximately 0.5% to approximately 10%. Liner layer 29 acts as a void movement blocking layer for reducing the movement of first polysilicon layer 28 during a subsequent thermal process.

Figure 4I:
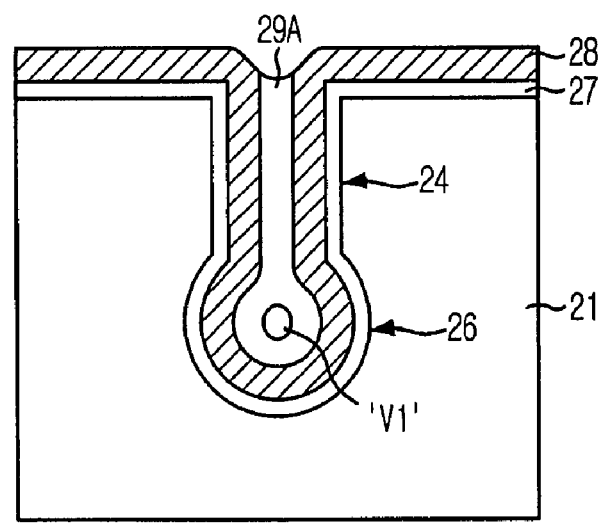

Referring to FIG. 4I, a portion of liner layer 29 over first polysilicon layer 28 is removed using a wet or dry etch process to thereby form a liner 29A. Therefore, liner 29A remains only in ball pattern 26 and trench pattern 24. For example, the wet etch process may be performed using a buffered oxide etch (BOE) or HF solution when liner layer 29 includes an oxide-based material. Alternatively, the wet etch process may be performed using a phosphoric acid solution when liner layer 29 includes a nitride-based material. The dry etch process of liner layer 29 uses an etch-back process.

Figure 4J:
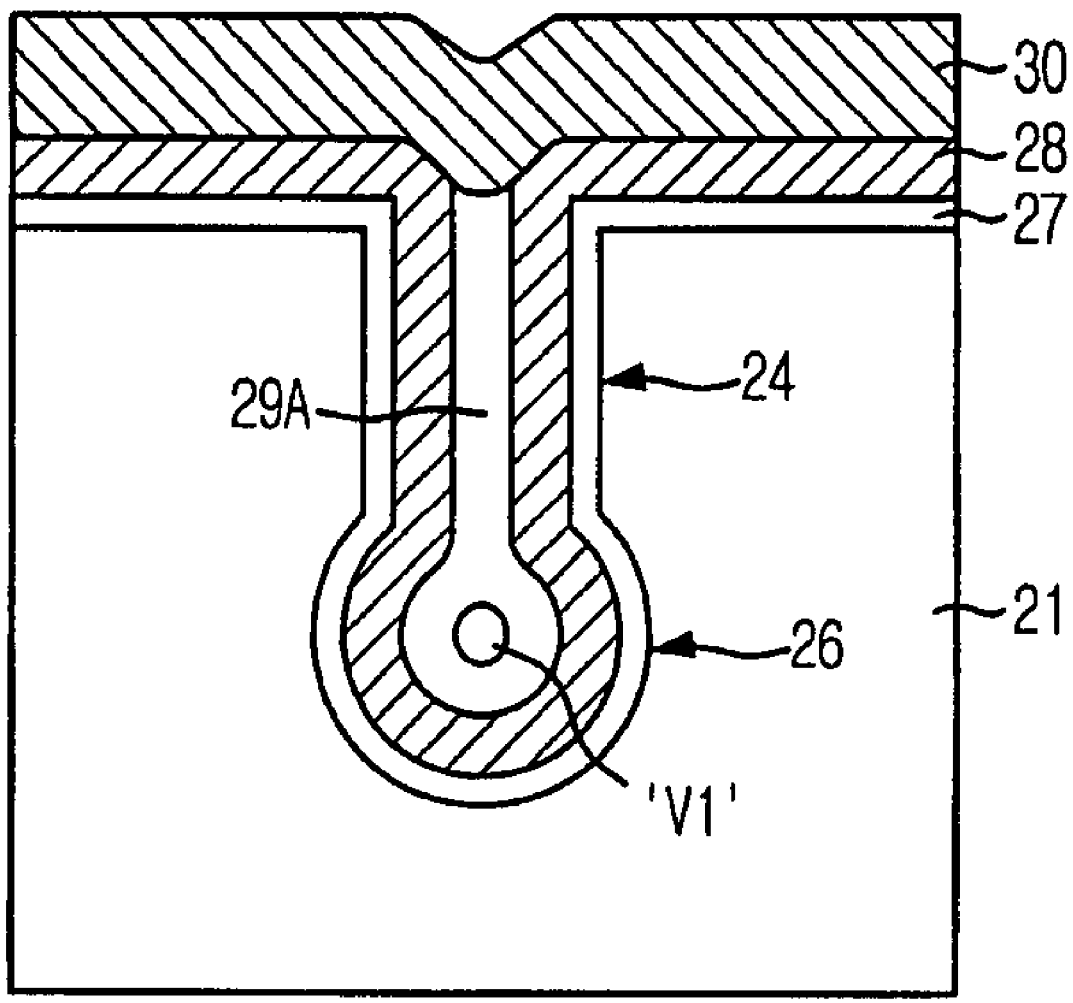

Referring to FIG. 4J, a second conductive layer 30 is formed over first polysilicon layer 28 and liner 29A. Second conductive layer 30 may include a polysilicon. Thus, second conductive layer 30 is referred to as second polysilicon layer 30 hereinafter. Since liner 29A is formed such that liner 29A is inserted between portions of first polysilicon layer 28 in the bulb-type recess pattern, the movement of first polysilicon layer 28 is restricted even during the subsequent high temperature thermal process. Thus, void V1 stays in the center of liner 29A.

Although liner 29A remains, second polysilicon layer 30 is in contact with first polysilicon layer 28 where liner 29A is not formed. Therefore, first polysilicon layer 28 and second polysilicon layer 30 can function as a gate electrode.

Second polysilicon layer 30 may be formed at a temperature ranging from approximately 450° C. to approximately 650° C. Second polysilicon layer 30 may be doped in situ with impurities such as phosphorous or boron. The impurities may be doped at a doping concentration ranging from approximately $5 \times 10^{19}$ cm$^{-3}$ to approximately $5 \times 10^{20}$ cm$^{-3}$.

There is no limitation on the thickness of second polysilicon layer 30 because the thickness of second polysilicon layer 30 is irrelevant with respect to the void generation. For example, second polysilicon layer 30 may be formed to a thickness ranging from approximately 30 Å to approximately 300 Å, i.e., substantially the same thickness as first polysilicon layer 28.

Consistent with an embodiment of the present invention, the polysilicon layer deposition for use as a gate electrode is performed in two steps: forming the first polysilicon layer and forming the second polysilicon layer. Also, the liner layer including an oxide-based material functioning as a void movement blocking layer is employed between the first and second polysilicon layers. Therefore, the movement of a void toward the gate insulating layer can be reduced. Thus, it is possible to fabricate a transistor including a bulb-type recess channel with improved reliability.

While the present invention has been described with respect to various embodiments, it will be apparent to those skilled in the art that various changes and modifications may be made without departing from the spirit and scope of the invention as defined in the following claims.

What is claimed is:

1. A method for fabricating a transistor including a bulb-type recess channel, the method comprising:
    forming a bulb-type recess pattern in a substrate, wherein the bulb-type recess pattern includes a trench pattern and a ball pattern;
    forming a gate insulating layer over the substrate and the bulb-type recess pattern;
    forming a first gate conductive layer over the gate insulating layer;
    forming a void movement blocking layer by forming a liner layer over the first gate conductive layer in the bulb-type recess pattern to fill the bulb-type recess pattern and removing portions of the liner layer such that the void movement blocking layer remains only in the bulb-type recess pattern, wherein the void movement blocking layer, the gate insulating layer, and the first gate conductive layer completely fill the trench pattern; and
    forming a second gate conductive layer over the void movement blocking layer and the first gate conductive layer,
    wherein, in removing the portions of the liner layer such that the void movement blocking layer remains only in the bulb-type recess pattern, the first gate conductive layer is not removed in areas of the first gate conductive layer over and outside the bulb-type recess pattern.

2. The method of claim 1, wherein the liner layer comprises an oxide-based layer or a nitride-based layer.

3. The method of claim 2, wherein the oxide-based layer comprises silicon oxide ($SiO_2$), spin on glass (SOG), phosphosilicate glass (PSG), where concentration of phosphorus (P) is in a range of approximately 0.5% to approximately 10%, or borosilicate glass (BSG), where concentration of boron (B) is in a range of approximately 0.5% to approximately 10%.

4. The method of claim 2, wherein the nitride-based layer comprises silicon oxynitride (SiON) or silicon nitride ($Si_3N_4$).

5. The method of claim 2, wherein the liner layer is formed to a thickness ranging from approximately 30 Å to approximately 300 Å.

6. The method of claim 1, wherein removing the portions of the liner layer comprises using a wet or dry etching process.

7. The method of claim 1, wherein forming the first gate conductive layer comprises forming the first gate conductive layer to a certain thickness such that an opening of the bulb-type recess pattern is not closed.

8. The method of claim 7, wherein the first gate conductive layer is formed to a thickness ranging from approximately 30 Å to approximately 300 Å.

9. The method of claim 7, wherein the first and second gate conductive layers comprise a polysilicon layer doped in situ with impurities.

10. The method of claim 9, wherein the impurities comprise phosphorous or boron, and the impurities are doped at a doping concentration ranging from approximately $5 \times 10^{19}$ cm$^{-3}$ to approximately $5 \times 10^{20}$ cm$^{-3}$.

11. The method of claim 1, wherein, by not removing the first gate conductive layer in areas of the first gate conductive layer over and outside the bulb-type recess pattern, the first gate conductive layer lies between the second conductive layer and the gate insulating layer in areas of the first gate conductive layer outside the bulb-type recess pattern after the formation of the void movement blocking layer.

* * * * *